United States Patent
Kahl et al.

(10) Patent No.: US 6,420,649 B1
(45) Date of Patent: Jul. 16, 2002

(54) PROCESS FOR SHIELDING AN ELECTRIC OR ELECTRONIC CIRCUIT AND SHIELDING CAP

(76) Inventors: Helmut Kahl, Horstwalder Str. 3, 12307 Berlin (DE); Bernd Tiburtius, Rosenhag 10, 14532 Kleinmachow (DE)

(*) Notice: Subject to any disclaimer, the term of this patent is extended or adjusted under 35 U.S.C. 154(b) by 0 days.

(21) Appl. No.: 09/242,460

(22) PCT Filed: Aug. 18, 1997

(86) PCT No.: PCT/IB97/01001

§ 371 (c)(1),
(2), (4) Date: May 18, 1999

(87) PCT Pub. No.: WO98/08365

PCT Pub. Date: Feb. 26, 1998

(30) Foreign Application Priority Data

Aug. 18, 1996 (DE) .......................... 196 34 174

(51) Int. Cl.$^7$ .................................. H05K 9/00
(52) U.S. Cl. ............... 174/35 R; 174/35 GC; 277/316
(58) Field of Search .............. 174/35 R, 35 GC, 174/35 MS; 277/316, 590; 428/35.8, 331, 423.1; 524/93; 521/76

(56) References Cited

U.S. PATENT DOCUMENTS

| | | | | |
|---|---|---|---|---|
| 3,885,084 A | * | 5/1975 | Kaiserswerth et al. | 174/35 MS X |
| 3,942,408 A | * | 3/1976 | Bernath | 86/19 |
| 4,099,928 A | * | 7/1978 | Norback | 29/890.039 |
| 4,388,132 A | * | 6/1983 | Hoge et al. | 174/35 R X |
| 4,678,863 A | * | 7/1987 | Reese et al. | 174/35 GC X |
| 4,857,668 A | * | 8/1989 | Buonanno | 174/35 GC |
| 4,931,479 A | * | 6/1990 | Morgan | 521/76 |
| 4,934,666 A | | 6/1990 | Balsells | |
| 5,004,866 A | * | 4/1991 | Cooke et al. | 174/35 GC |
| 5,008,485 A | * | 4/1991 | Kitagawa | 174/35 GC X |
| 5,014,160 A | * | 5/1991 | McCoy, Jr. | 174/35 R X |

(List continued on next page.)

FOREIGN PATENT DOCUMENTS

| | | |
|---|---|---|
| DE | 66 07 180 | 1/1971 |
| DE | 94 04 291 | 6/1994 |
| EP | 0 643 551 | 3/1995 |
| EP | 0 643 552 | 3/1995 |
| JP | 5-7177 | 1/1993 |
| JP | WO 96/22672 | 7/1996 |

OTHER PUBLICATIONS

K. Sato, "Shielding Method", Patent Abstracts of Japan, JP 07 221482, Aug. 18, 1995 (Abstract only).
T. Yamashita, "Shielding Device", Patent Abstracts of Japan, JP 03 179799, Aug. 5, 1991 (Abstract only).

Primary Examiner—Lynne H. Browne
Assistant Examiner—David E. Bochna
(74) Attorney, Agent, or Firm—Finnegan, Henderson, Farabow, Garrett & Dunner, L.L.P.

(57) ABSTRACT

A process is disclosed for screening a part of an electrical or electronic circuit, which part is surrounded by an electrically-conductive frame, from absorbing and/or emitting electromagnetic interference fields. The process comprises taking an electrically-conductive screening cap, with an open side bordered by a rim that contains a seating surface, and forming an elastic and electrically-conductive screening seal by directly applying the sealing compound to the seating surface in such a way that the screening seal projects beyond the seating surface. The screening cap is then placed with the screening seal on the electrically-conductive frame to fix the screening cap on the electrically-conductive frame.

29 Claims, 6 Drawing Sheets

U.S. PATENT DOCUMENTS

Figure 1A:
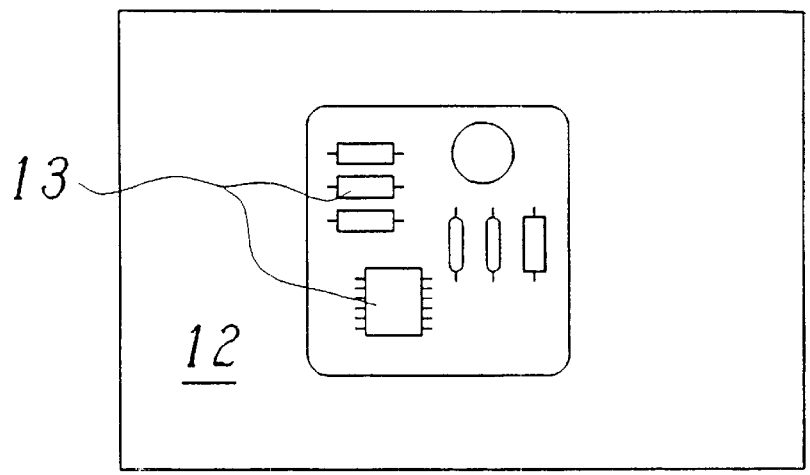

| | | | |
|---|---|---|---|
| 5,061,566 A | * 10/1991 | Morgan | 428/423.1 |
| 5,091,606 A | 2/1992 | Balsells | |
| 5,202,536 A | * 4/1993 | Buonanno | 174/35 GC |
| 5,256,480 A | * 10/1993 | Inoue et al. | 428/331 |
| 5,270,364 A | * 12/1993 | Schwartz et al. | 524/93 |
| 5,284,888 A | * 2/1994 | Morgan | 524/93 |
| 5,508,889 A | * 4/1996 | Ii | 174/35 R X |
| 5,559,676 A | * 9/1996 | Gessaman | 174/35 GC X |
| 5,566,055 A | * 10/1996 | Salvi, Jr. | 174/35 R X |
| 5,641,438 A | * 6/1997 | Bunyan et al. | 264/40.3 |
| 5,714,102 A | 2/1998 | Highum et al. | |
| 5,731,541 A | * 3/1998 | Bernd et al. | 174/35 GC |
| 5,825,634 A | * 10/1998 | Moorehead, Jr. | 174/35 GC X |
| 5,847,938 A | 12/1998 | Gammon | |
| 5,882,729 A | * 3/1999 | Kahl et al. | 174/35 MS X |
| 5,945,213 A | 8/1999 | Nagalke et al. | |
| 5,968,854 A | 10/1999 | Akoplan et al. | |
| 6,051,779 A | 4/2000 | Gammon | |
| 6,058,024 A | * 5/2000 | Lyford | 174/35 R X |
| 6,060,659 A | * 5/2000 | Borowiec et al. | 174/35 R |

* cited by examiner

PROCESS FOR SHIELDING AN ELECTRIC OR ELECTRONIC CIRCUIT AND SHIELDING CAP

TECHNICAL FIELD

The present invention concerns the field of electromagnetic screening. It deals with a process to screen an electrical or electronic circuit from absorbing and/or emitting disturbing electromagnetic rays whereby an electrically-conductive screening cover has a seating surface with an elastic and electrically-conductive screening seal that projects beyond the seating surface, and then the seating surface with the screening seal is placed on and fixed to an electrically-conductive frame that surrounds the circuit.

The invention also concerns a screening cover to screen an electrical or electronic circuit from absorbing and/or emitting disturbing electromagnetic rays. The screening cover has a seating surface for placing the screening cover on an electrically-conductive frame surrounding the circuit. The seating surface is provided with an elastic and electrically-conductive screening seal that projects beyond the seating surface.

Such a process and screening cover are e.g. prior art in German utility model G66071805.

STATE OF THE ART

To electromagnetically screen electronic circuits or circuit parts so that they do not absorb and/or emit especially high-frequency disturbing electromagnetic interference fields, the circuits or circuit parts are covered with an electrically-conductive cup or tub-shaped screening cover. The edge or seating surface of the screening cover is placed on an electrically-conductive frame that surrounds the circuit, and it is fixed in place. The frame can e.g. consist of a copper layer that is on the top of the p.c.b. which bears the circuit.

A problem with screening covers is getting a consistent electrical contact that extends along the entire edge of the cover between the screening cover and frame; another problem is securely fixing screening cap in the screening position. To adapt the seating surface of the screening cover to unevenness in the frame and prevent undesirable holes in the screen, the edge of the screening cover can e.g. be elastic or contact the frame via a contact spring strip. It is also suggested in the initially-cited document that the transition between the seating surface and frame be an electrically-conductive, elastically-deformable screen seal. If the screen comprises a lid, the screening seal consists of a flat foam layer on the bottom of the lid that either is made electrically-conductive from conductive additives (carbon or metal powder), or by vapor-deposition of metals, or by adhering a metal film. If the screen comprises a screening cover, there is a groove in the edge of the cover in which a peripheral ring of foam is inserted that is either electrically-conductive itself, or has been made electrically-conductive by treating its surface. The groove is formed by spot-welding shaped sheet metal on the inside of the high edge of the screening cover. The addition of such a groove not only adds more effort to the manufacture of the screening cover, it also takes up more space. In addition, the groove is difficult to manufacture when the shape of the screening cover is complicated and has angles.

PRESENTATION OF THE INVENTION

The problem of the invention is therefore to present a process to screen an electrical or electronic circuit and to present a screening cover that is distinguished by outstanding screening, ease of use, and a great deal of flexibility.

The problem is solved with a process of the initially-cited type in that the screening seal is created by directly applying a sealing compound to the seating surface. By directly applying the sealing compound according to the invention, the creation of a groove or another special recess for the seal becomes superfluous. This is particularly advantageous when the seating surface of the screening cover is a simple edge. The sealing compound is directly applied to the face of the edge following the (possibly complicated) path of the edge, and then anchored there. A minimum of space and (expensive) sealing compound are used to create and optimum screening seal for the screening cover.

A first preferred embodiment of the procedure according to the invention is characterized in that the sealing compound is applied by an application process as disclosed in another context, i.e., for screening housings e.g. in DE C2 43 19 965. The pasty or slightly liquid sealing compound can be applied in a precise dose and with a preset cross-section directly to the edge of the screening cover. With corresponding control (programming) of a dispenser that can move along three axes, complicated edge shapes of the screening cover can be followed. The properties of the sealing compound are suitably adjusted so that the bead of sealing compound that is applied to the edge hardens on the edge without running. In a development of this embodiment, several sealing beads are applied on each other to form the screening seal. The greater height of the screening seal compensates for correspondingly greater tolerances between the frame and contact surface.

In a second preferred embodiment of the process according to the invention, the sealing compound is applied to the seating surface by using a flowable sealing compound. The screening cover is immersed with the seating surface in a bath consisting of the sealing compound, and then it is removed. The sealing compound wets the edge or seating surface of the screening cover and forms a bead that surrounds the edge by means of surface tension when it is removed, and a peripheral screening seal is formed after hardening. The advantage of this embodiment is that the entire edge can be quickly and easily provided with the screening seal without using a numerically-controlled applicator and meter. The thickness of the forming screening seal is largely determined by the properties of the sealing compound in the bath and can e.g. also be influenced by repeating the immersion procedure. If the sealing compound is a (curing) material that hardens when exposed to humidity, the immersion process should be carried out under an inert gas.

It is preferable when the sealing compound is an electrically-conductive elastomer, especially based on silicone or polyethylene that contains electrically-conductive fillers. The screening seal is created by directly applying the sealing compound without additional steps. Examples of such compounds are found in European patent application 0 643 551 and 0 643 552. Alternately, the sealing compound can be an electrically-insulating elastomer, and the sealing compound is provided with an electrically-conductive coating, especially in by metallization, after it is applied to the seating surface. This type of manufacture is particularly advantageous when a screening cover is used that consists of an electrically-insulating material, and when the screening cover and sealing compound are both provided with an electrically-conductive coating, especially by metallization after the sealing compound has been applied to the seating surface. The expensive, electrically-conductive and some-]

what difficult to process sealing compound can be dispensed with, and plastic screening covers can be used that are easy to make in different configurations with the usual methods of plastic processing (injection molding, blow-molding, etc.).

The screening cover can be affixed in various ways in the context of the invention. In a preferred exemplary embodiment, the screening cover can be mechanically fixed after it is placed on the frame. Auxiliary means can be used to mechanically affix it that press the screening cover with the screening seal on the frame. The auxiliary means are preferably a spring clip, screw, an opposing housing part or a spring sheet metal part that is attached to the screening cover, and especially a part of the screening cover made of sheet metal.

In another preferred exemplary embodiment, the screening cover adheres to the frame after the screening seal is placed on the frame. This can be accomplished by using an electrically-conductive elastomer as the sealing compound that is adhesive or wet and can be hardened by heat or radiation; it is hardened after the screening cover is placed on the frame. An electrically-conductive elastomer can be used that is adhesive or wet even after hardening. The screening cover can adhere to the frame by using an elastically-conductive thermoplastic or an electrically-conductive hot-melt adhesive as the sealing compound, and the screening cover is glued to the frame by increasing the temperature after it is placed on the frame.

The screening cover according to the invention is characterized in that the screening seal consisting of the sealing compound is molded onto the seating surface.

In a preferred embodiment, the screening cover according to the invention is characterized in that the seating surface is an edge, and either the screening seal is placed on the face of the edge, or the screening seal encloses the edge.

Additional embodiments are found in the dependant claims.

SHORT EXPLANATION OF THE FIGURES

The invention will be further explained using exemplary embodiments in connection with the drawing.

Figure 1B:
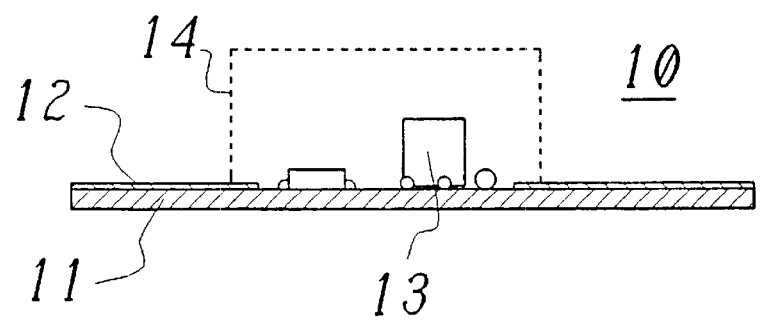
Figure 2:
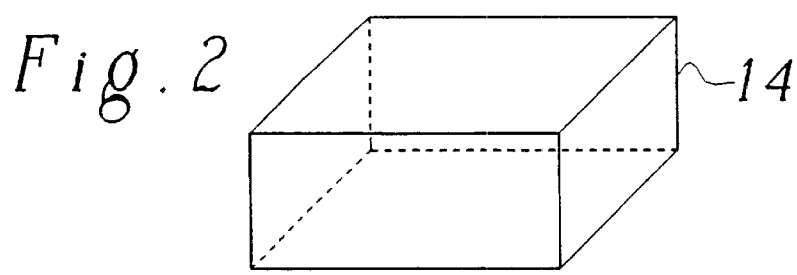
Figure 3A:
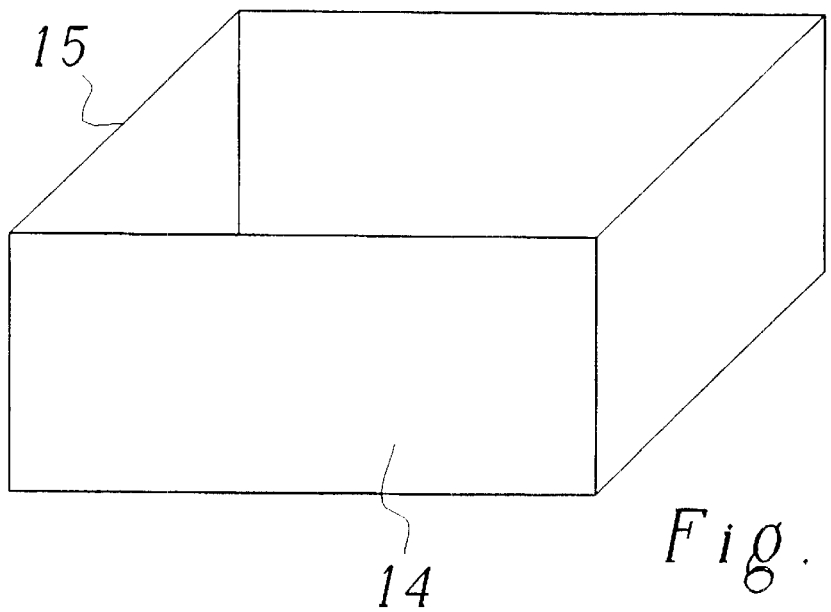
Figure 3B:
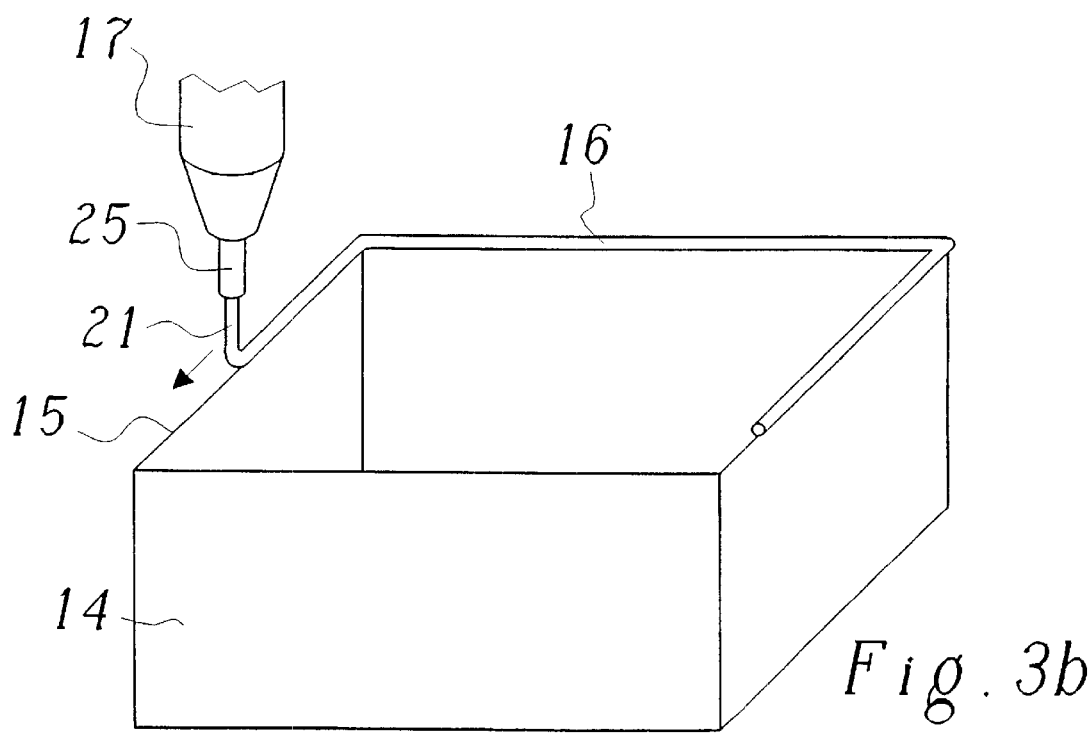
Figure 4:
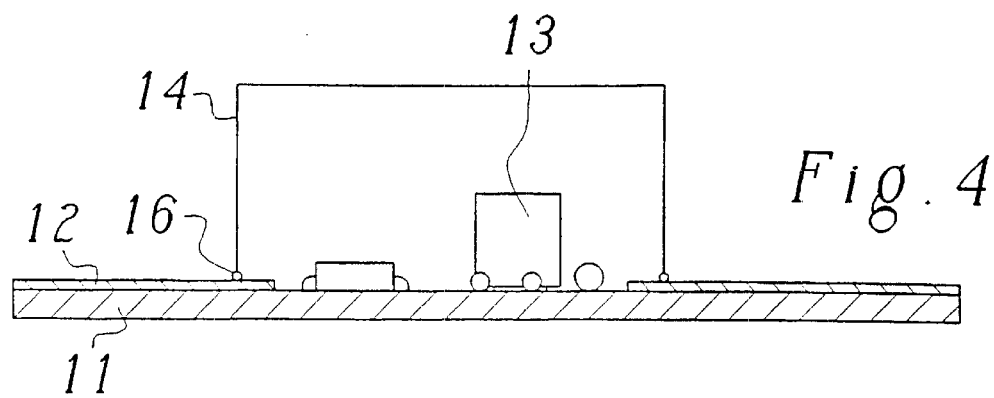
Figure 5:
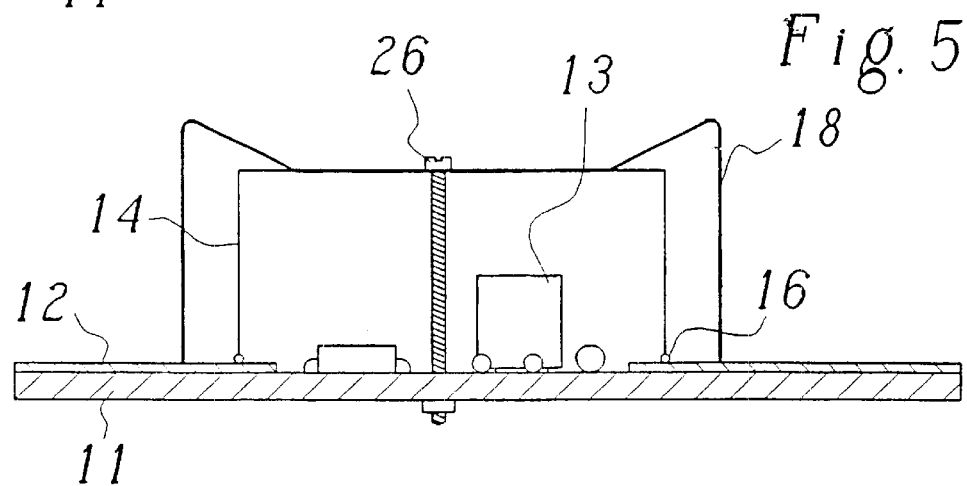
Figure 6:
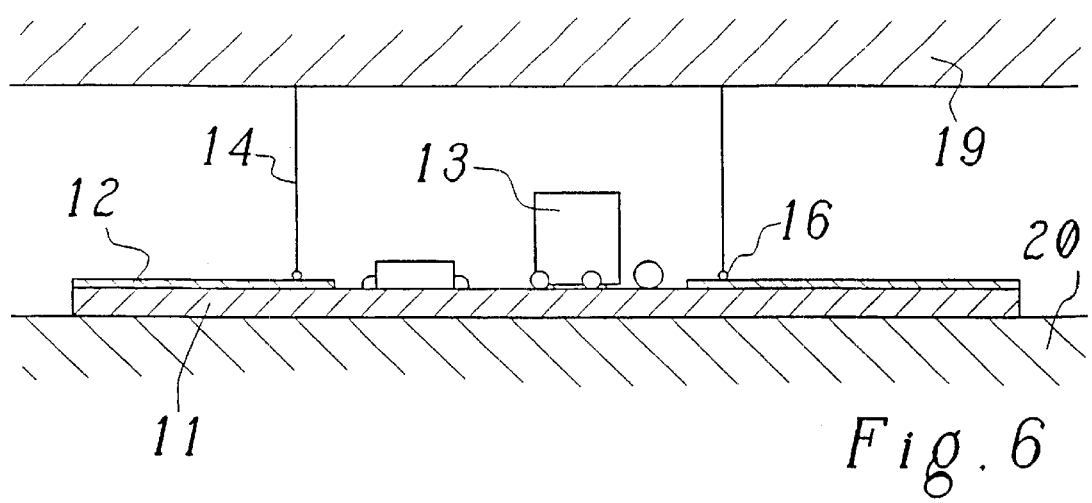
Figure 7A:
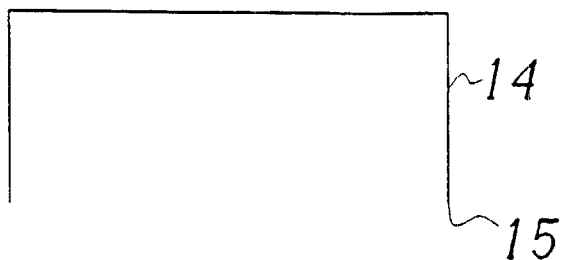
Figure 7B:
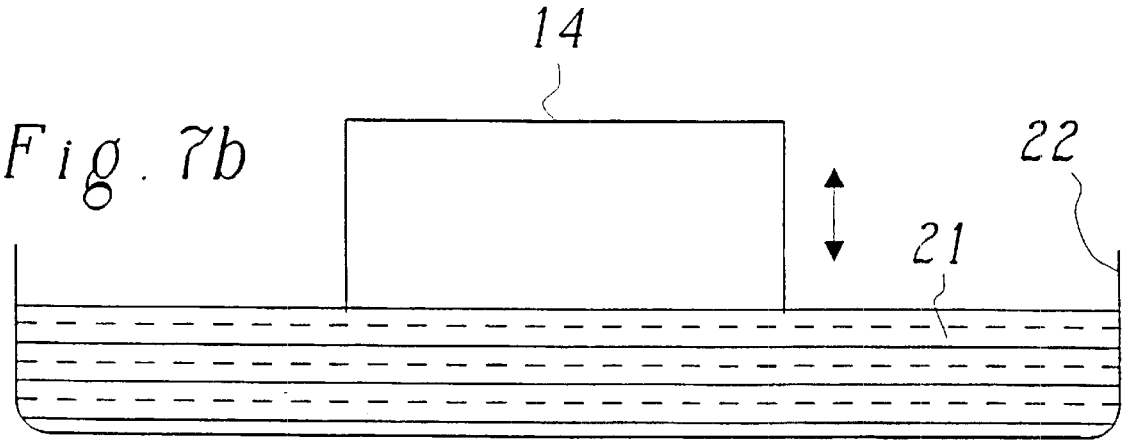
Figure 7C:
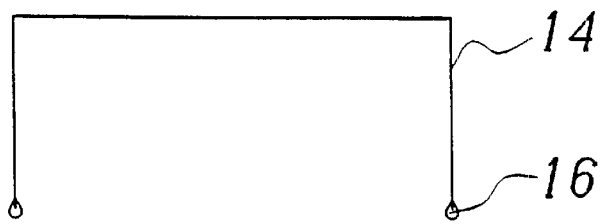
Figure 8:
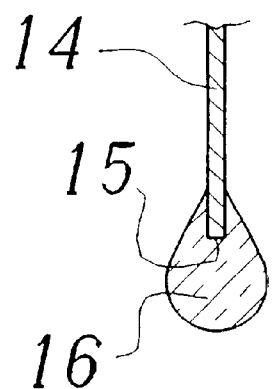
Figure 9:
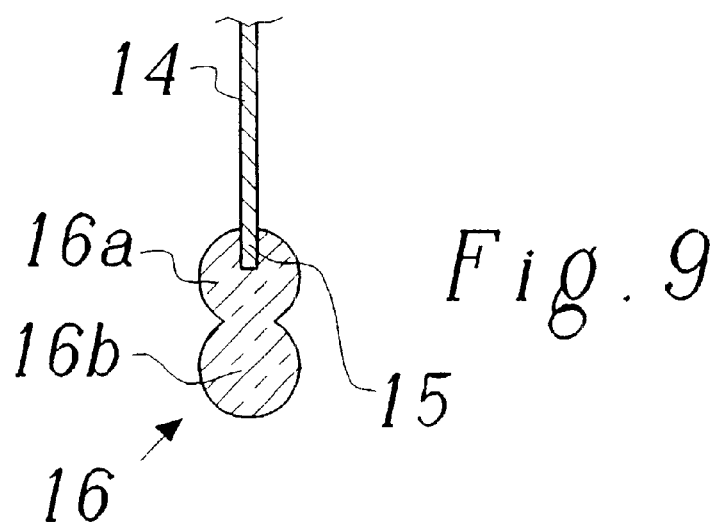
Figure 10:
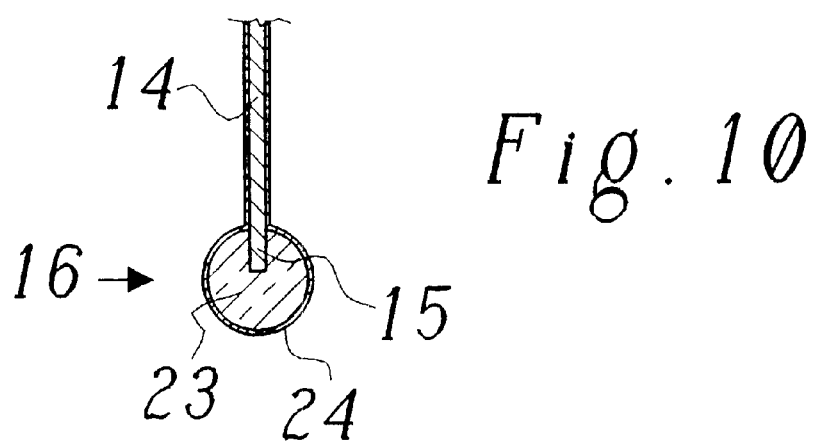
Figure 11:
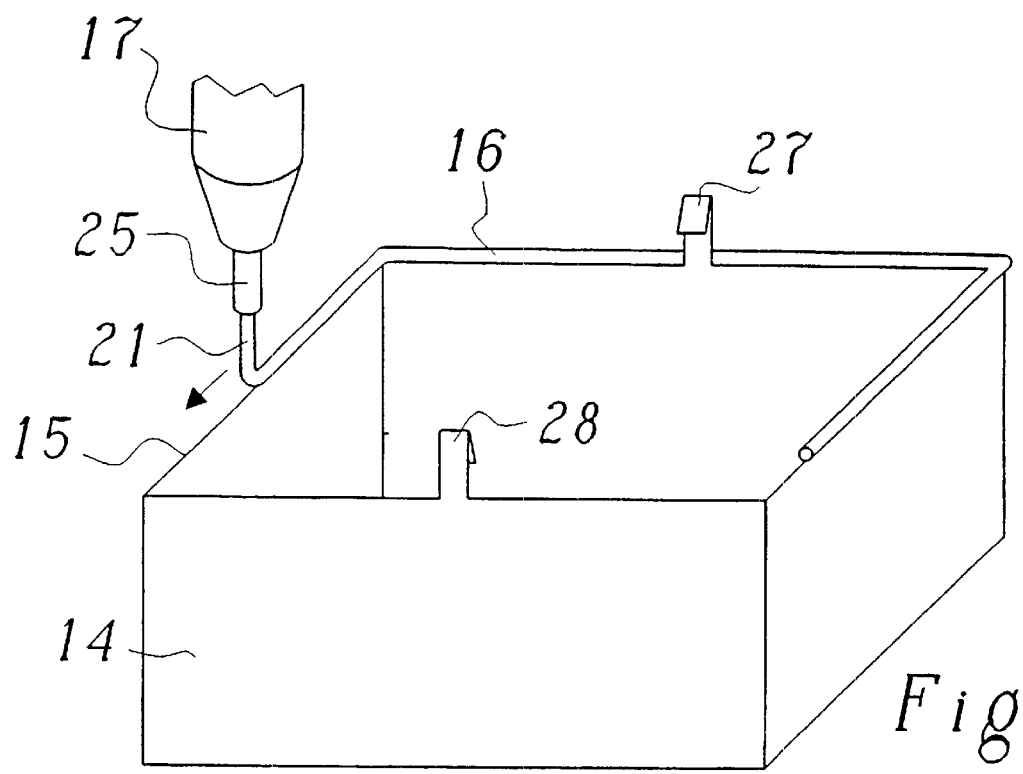
Figure 12:
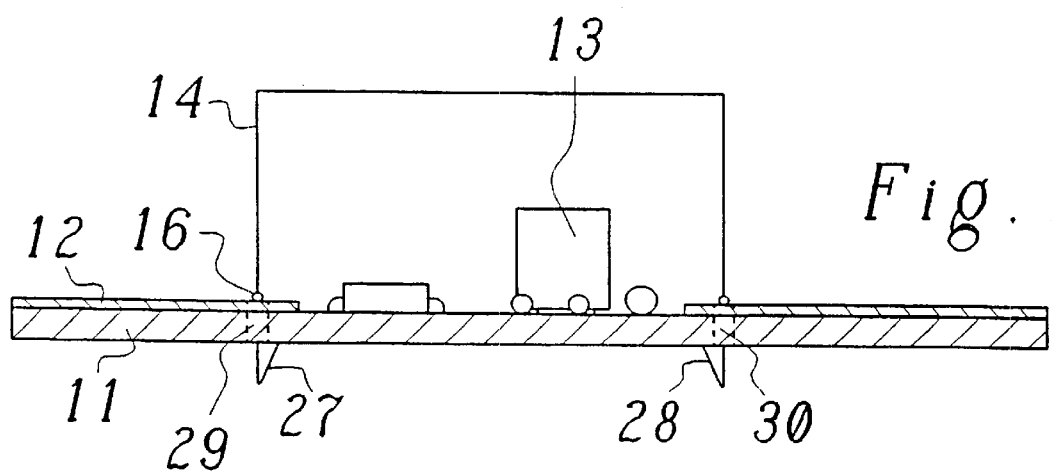

FIG. 1 A top view (FIG. 1a) of an example of a circuit on a p.c.b. without a screening cover, and a side view of a screening cover drawn in dashed lines (FIG. 1b);

FIG. 2 A perspective view of the screening cover from FIG. 1b (with a bottom opening);

FIG. 3 A screening seal placed on the screening cover from FIG. 2 according to a first preferred exemplary embodiment of the procedure according to the invention. The screening cover is first positioned with the opening (edge) facing upward (FIG. 3a), and then the screening seal is applied to the edge with a moving dispenser (FIG. 3b);

FIG. 4–6 Side view of various ways of attaching the screening cover within the framework of the invention, i.e., with an adhesive screening seal (FIG. 4), a spring clip and/or a screw (FIG. 5), and by abutting an opposing housing part, etc. (FIG. 6);

FIGS. 7a–c Different steps in creating the screening seal by immersing the screening cover in a bath consisting of a (liquid) sealing compound according to second preferred exemplary embodiment of the invention;

FIGS. 8–10 Sections of different types of screening seals according to the invention that have been made by immersion according to FIG. 7 (FIG. 8), or by applying a second bead of sealing compound according to FIG. 3 (FIG. 9), or by metallizing a non-conductive seal (FIG. 10);

FIG. 11 The application of a screening seal comparable to FIG. 3b on a screening cover that is equipped with spring sheet metal parts for attachment; and FIG. 12 Side view of attaching the screening cover from FIG. 11 with spring sheet metal parts that are inserted through openings into the p.c.b. and then elastically lock.

WAYS TO IMPLEMENT THE INVENTION

FIG. 1 shows a top view (FIG. 1a) and side view (FIG. 1b) of an example of a circuit on a p.c.b. without a screening cover. The circuit 10 comprises a p.c.b. 11 (printed circuit or multilayer) on which several electronic components 13 (resistors, capacitors, diodes, ICs, etc.) are located and connected in a central area. The components 13 form a partial circuit that is to be screened from other partial circuits or the environment so that no disturbing electromagnetic fields are emitted by the partial circuit or are absorbed from the outside. The partial circuit is surrounded by a conductive frame 12 in the form of a top metal layer on the p.c.b. 11. Of course, the partial circuit, frame 12 and construction of the circuit 10 can have different shapes or designs.

The partial circuit with the components 13 is screened by a cup-shaped screening cover (14) (drawn with dashed lines in FIG. 1b) and is shown in a perspective view in FIG. 2. The screening cover 14 is in the shape of a rectangular box in the portrayed example. Of course, the screening cover can be round or obliquely angled and have bulges, projections, etc. The screening cover 14 can be bent from a sheet, soldered or formed (deep-drawn). It can also consist of metallized plastic. The screening cover 14 is placed over the partial circuit as indicated in FIG. 1b. The edge neighboring the open side of the screening cover 14 forms the seating surface and lies on the frame 12 to create a tight and electrically-conductive transition from the screening cover 14 to the frame 12.

To compensate for unevenness, an elastic and electrically-conductive screening seal is provided between the edge or seating surface of the screening cover 14 and the frame 12. The screening seal provides the electrical contact between the screening cover 14 and the frame 12 and can compensate for tolerances of several tenths of a millimeter. In one preferred exemplary embodiment of the invention, the screening seal is created and applied to the screening cover 14 in that the sealing compound that forms the screening seal is directly applied to the edge (dispensed) in the form a bead. In FIG. 3a, the screening cover 14 with the edge seating surface 15 is placed facing up on the base of a dispensing device. In FIG. 3b, the dispenser 17 as e.g. described in DE C2 43 19 965 travels by numerical control along the seating surface 15. The sealing compound 21 (preferably pasty or thixotropic) is deposited under pressure from a nozzle 25 in the form of a bead onto the seating surface 15, and it forms a screening seal 16. If the screening cover 14 has conventional wall thickness (sheet metal thickness) of a few tenths of a millimeter, the thickness of the (usually round) bead is ca 0.1 to 2 mm.

The properties of the sealing compound 21 are adjusted so that the bead basically retains its shape and cross-section after being placed on the seating surface 15, and it also adheres to the seating surface. An electrically-conductive elastomer based on silicone or polyurethane that contains electrically-conductive fillers is used as the sealing compound 21, or an electrically-conductive elastomer is used. In this case, the sealing compound 21 is provided with an electrically-conductive coat, especially in the form of a metal coating 24 after being applied to the seating surface 15.

The sealing compound 21 can have a solid, plastic or adhesive consistency. It can be directly curable or hardenable by humidity when the screening cover 14 is not to be adhered tightly to the frame 12. It can also curable by heat or radiation (UV, IR, X-ray or laser) when e.g. the screening cover 14 is to be tightly adhered with the screening seal to the frame 12. The compound is only hardened in this case when the screening cover 14 has been put in place. If a sealing compound is used that is adhesive after it has hardened, the screening cover can also be adhered after it is hardened. Alternately, it is also conceivable for the sealing compound to be an electrically-conductive thermoplastic or an electrically-conductive hot-melt adhesive, and the screening cover 14 is adhered to the frame 12 by increasing the temperature when it is on the frame 12. Likewise, electrically-conductive or isotropic plastics can be used as the sealing compound 21.

The properties of the sealing compound applied in FIG. 3b allow the screening cover 14 to be directly applied to the frame. The screening cover 14 with the screening seal 16 can be directly placed on the frame 12 and adhered tight (FIG. 4). If the adhesive force is sufficient for permanently fixing the screening cover 14, additional auxiliary agents can be dispensed with which makes use easier. If the adhesive force is insufficient or if the screening seal is not adhesive, additional (primarily mechanical) auxiliary means are used to fix the screening cover 14. In the example in FIG. 5, a spring clip 18 is used whose ends are attached to the p.c.b., and whose elastic middle part is pressed from above onto the screening cover 14. Instead of a spring clip 18, clamps or similar fasteners can be used. Furthermore, auxiliary means such as one or more screws 26 can be used instead of or in addition to the spring clip 18. The screws are inserted through a hole in the screening cover 14 and screwed to the p.c.b. 11, or inserted through a hole in the p.c.b. 11 and screwed with an insert to the screening cover 14. Another option for fixing the cover is shown in FIG. 6. An opposing housing part 19 etc. is used to press the screening cover 14 against the p.c.b. 11 which abuts a base 20.

Another easy and simple method for fixing the cover is shown in FIGS. 11 and 12 in conjunction with a screening cover made of sheet metal. A screening cover 14 is used that has at least one and preferably two or more opposing spring sheet metal parts 27, 28. The strips of spring sheet metal 27, 28 extend upward from the seating surface 15 and are curved like a hook. They can be a part of the sheet (as shown in FIG. 11) from which the screening cover 14 is made. They can also be made of separate strips of sheet metal and be spot-welded, riveted, glued or soldered to the screening cover 14. In these cases, it is useful to bend the spring sheet metal parts 27, 38 slightly outward so that the seating surface 14 is completely covered with the screening seal 16.

The screening cover with the spring sheet metal parts 27, 28 is provided with the screening seal 16 as shown in FIG. 3b. Then the screening cover 14 from FIG. 12 can be mechanically affixed to the p.c.b. 11 with the spring sheet metal parts 27, 28. In the p.c.b. 11 are through-holes 29, 30 (drawn with dashed line in FIG. 12) at suitable sites, e.g. in the form of elongated holes or slots through which the spring sheet metal parts 27, 28 can be inserted and elastically lock when the screening cover 14 is put in place. This allows the screening cover 14 to be attached in a particularly easy and secure manner, and it is suitable for automated manufacture and does not require many additional parts and installation effort. In addition, a screening cover 14 affixed in this manner is easy to service and repair and can be removed and reused by pressing together the sheet-metal parts on the bottom of the p.c.b. 11 and pressing them back through the openings 29, 30.

The process shown in FIG. 3 for applying the screening seal 16 with a dispenser 17 requires corresponding equipment. In addition, the numerical control of the dispenser 17 must be adjusted in a program to the edge path of the respective screen cover 14. The amount of equipment can be clearly reduced when another process (immersion) is used to apply the screening seal to the seating surface 15 of the screening cover 14 that e.g. is schematically represented in FIG. 7. With the immersion process, the screening cover 14 with the opening or seating surface 15 facing down (FIG. 7a) is dipped in a bath with a liquid or highly viscous sealing compound 21 (FIG. 7b). The sealing compound 21 in the container 22 has a very even surface. If the edge of the screening cover 14 is slowly and evenly dipped in the sealing compound 21 a few tenths of a millimeter, the sealing compound 21 wets the edge. When the sealing cover 14 is removed from the bath, the surface tension at the edge of the cover forms an annular bead of sealant that forms a screening seal 16 which is tightly bonded to the edge after it hardens (FIG. 7c; see section in FIG. 8).

It is hence very easy to cover in a single step the entire edge of the screening cover 14 with a very even screening seal. The properties of the sealing compound (when liquid and uncured) must be adjusted so that the wetting behavior and surface tension produce the desired results. It is useful for the seating surface 15 of the screening cover 14 to be in a single plane for the immersion procedure. If the seating surface 15 is in different planes, the dispensing process in FIG. 3 is useful in which the dispenser 17 can be moved in three axes.

The dispensing process in FIG. 3 primarily produces a screening seal 16 with a round cross-section, while the dipping process in FIG. 7 tends to form a drop-shaped cross-section according to FIG. 8. If the screening seal 16 is to compensate for greater tolerances, its height must be greater. This can be accomplished by increasing the diameter of the screening seal. This however requires a comparatively large amount of expensive sealant. It is better to place several sealing beads 16a,b on each other as in FIG. 9 using the process in FIG. 3 that then form a narrow, high screening seal 16.

Another option for forming a conductive screening seal 16 is shown in FIG. 10. The screening seal 16 comprises a seal core 23 consisting of an electrically-insulating elastomer that is coated on the outside with metal 24. The sealing core 23 can be applied as in FIG. 3, and it can also be created by dipping as in FIG. 7. The metallization can be carried out in a manner known per se. A particularly advantageous solution is to use a screening cover 14 consisting of an electrically insulating material. In this case, the screening cover 14 and the sealing compound or sealing core 23 are both provided with an electrically-conductive coating, especially in the form of metal coating 24 after applying the sealing compound to the seating surface 15.

Overall, the invention presents a screening process, or a screening cover that is easy to implement and flexible to use, and that is distinguished by a low amount of manufacturing effort while retaining a high screening quality.

| REFERENCE NUMBER LIST | |
|---|---|
| 10 | Circuit |
| 11 | P.c.b. |
| 12 | Frame (conductive) |
| 13 | Component (electronic) |
| 14 | Screening cover |
| 15 | Seating surface (edge) |
| 16 | Screening seal |
| 16a, b | Sealant bead |
| 17 | Dispenser |
| 18 | Spring clip |
| 19 | Housing part |
| 20 | Base |
| 21 | Sealing compound |
| 22 | Container |
| 23 | Sealing core |
| 24 | Metal coating |
| 25 | Nozzle |
| 26 | Screw |
| 27, 28 | Spring sheet metal part |
| 29, 30 | Opening |

What is claimed is:

1. A process for screening a part of an electrical or electronic circuit which part is surrounded by an electrically-conductive frame, from absorbing and/or emitting electromagnetic interference fields, said process comprising the steps of:

taking an electrically-conductive screening cap the open side of which is bordered by a rim, said rim being provided with a seating surface;

forming an elastic and electrically-conductive screening seal by using a flowable and elastically hardening sealing compound, dipping said screening cap with said rim in a bath of said sealing compound such that said sealing compound adheres to said seating surface; and removing said screening cap with said adhering sealing compound from said bath, to apply said sealing compound on said seating surface such that said screening seal projects beyond the seating surface;

placing said screening cap with said screening seal on said electrically-conductive frame; and fixing said screening cap on said electrically-conductive frame.

2. A screening cap for screening a part of an electrical or electronic circuit from absorbing and/or emitting electromagnetic interference fields, said electrical or electronic circuit being arranged on a circuit board, and said part of said electrical or electronic circuit being surrounded by an electrically-conductive frame on said circuit board, whereby said screening cap comprises side walls which run essentially vertical with respect to said circuit board and which are bordered by seating surfaces adapted to make contact with said electrically-conductive frame on said circuit board when said screening cap is placed on said circuit board, and whereby said seating surfaces are provided with an elastic and electrically-conductive screening seal that adheres to and projects beyond said seating surfaces.

3. A screening cap according to claim 2, characterized in that the seating surfaces are edges, and the screening seal is placed on the face of the edges.

4. A screening cap according to claim 2, characterized in that the seating surfaces are edges, and the screening seal surrounds the edges.

5. A screening cap according to one of claims 3, 4, or 2, characterized in that the screening seal has the shape of one or more sealing beads.

6. A screening cap according to one of claims 3, 4, or 2, characterized in that the screening seal consists of an electrically-conductive elastomer, especially based on silicone or polyurethane with electrically-conductive fillers.

7. A screening cover according to claim 6, characterized in that the electrically-conductive elastomer has an adhesive or wet consistency and can be hardened by heat or radiation.

8. A screening cap according to one of claims 3, 4, or 2, characterized in that the screening seal consists of an electrically-conductive thermoplastic or an electrically-conductive hot-melt adhesive.

9. A screening cap according to one of claims 3, 4, or 2, characterized in that the screening seal comprises a sealing core consisting of an electrically-insulating elastomer that is provided with a metal coating.

10. A screening cap according to one of claims 3, 4, or 2, characterized in that the screening cap consists of a metallized insulation.

11. A process for screening a part of an electrical or electronic circuit from absorbing and/or emitting electromagnetic interference fields, whereby said electrical or electronic circuit is arranged on a circuit board, and whereby said part of said electrical or electronic circuit is surrounded by an electrically-conductive frame on said circuit board, said process comprising the steps of:

taking an electrically-conductive screening cap with side walls which run essentially vertical with respect to said circuit board and which are bordered by seating surfaces adapted to make contact with said electrically-conductive frame on said circuit board when said screening cap is placed on said circuit board;

forming an elastic and electrically-conductive screening seal by directly applying an electrically-conductive sealing compound on said seating surfaces of said side walls such that said electrically-conductive screening seal adheres to and projects beyond said seating surfaces;

placing said screening cap with said electrically conductive screening seal on said electrically-conductive frame; and fixing said screening cap to said circuit board.

12. A process according to claim 11, wherein said adhesive sealing compound is applied to said seating surfaces by:

using a flowable and elastically hardening sealing compound;

dipping said screening cap with said seating surfaces in a bath of said sealing compound such that said sealing compound adheres to said seating surfaces; and removing said screening cap with said adhering sealing compound from said bath.

13. A process according to claim 11, characterized in that the sealing compound is applied in the form of at least one bead to the seating surfaces by a dispenser through a nozzle.

14. A process according to claim 13, characterized in that several sealing beads are applied on top of each other to from the screening seal.

15. A process according to one of the claims 2, 3, 11, or 12, characterized in that an electrically-conductive elastomer is used as the sealing compound.

16. A process according to claim 15, characterized in that an electrically-conductive elastomer based on silicone or polyurethane is used that contains electrically-conductive fillers.

17. A process according to one of claims 2, 3, 11, or 12, characterized in that an electrically-insulating elastomer is used as the sealing compound, and the sealing compound is provided with an electrically-conductive coating, especially in the form of metal coating after it is applied to the seating surfaces.

18. A process according to claim 17, characterized in that a screening cap is used that consists of an electrically-insulating material, and the screening cap and sealing compound are both provided with an electrically-conductive coating, especially in the form of metal cover, after the sealing compound has been applied to the seating surfaces.

19. A process according to one of the claims 2, 3, 11, or 12, characterized in that electrically-conductive or isotropic plastics are used as the sealing compound.

20. A process according to one of the claims 11 or 12, characterized in that the screening cap is mechanically fixed after it is placed on the frame.

21. A process according to claim 20, characterized in that auxiliary means are used to mechanically affix the cover, and the auxiliary means press the screening cap with the screening seal against the frame.

22. A process according to claim 21, characterized in that the auxiliary means comprise a spring clip.

23. A process according to claim 21, characterized in that the auxiliary means comprise a screw.

24. A process according to claim 21, characterized in that the auxiliary means comprise an opposing housing part.

25. A process according to claim 21, characterized in that the auxiliary means comprise spring sheet metal parts that are on the screening cover.

26. A process according to one of the claims 11 or 12, characterized in that the screening cap is adhered to the frame with the screening seal after it is placed on the frame.

27. A process according to claim 26, characterized in that an adhesive or wet electrically-conductive elastomer is used as the sealing compound.

28. A process according to claim 27, characterized in that the sealing compound is hardenable by heat or radiation, and it is hardened after the screening cap is placed on the frame.

29. A process according to claim 26, characterized in that an electrically-conductive thermoplastic or hot-melt adhesive is used as the sealing compound, and the screening cap is adhered after it is placed on the frame by increasing the temperature at the frame.

* * * * *

UNITED STATES PATENT AND TRADEMARK OFFICE
CERTIFICATE OF CORRECTION

PATENT NO. : 6,420,649 B1
DATED : July 16, 2002
INVENTOR(S) : Kahl et al.

It is certified that error appears in the above-identified patent and that said Letters Patent is hereby corrected as shown below:

Column 8,
Line 54, "from" should read -- form --.
Lines 55 and 56, "claims 2, 3, 11, or 12," should read -- claims 13, 14, 11, or 12, --.
Line 62, "claims 2, 3, 11, or 12," should read -- claims 13, 14, 11, or 12, --.

Column 9,
Lines 7 and 8, "claims 2, 3, 11, or 12," should read -- claims 13, 14, 11, or 12, --.

Signed and Sealed this

Third Day of June, 2003

JAMES E. ROGAN
*Director of the United States Patent and Trademark Office*